United States Patent
Lee et al.

(10) Patent No.: US 8,188,469 B2
(45) Date of Patent: May 29, 2012

(54) TEST DEVICE AND A SEMICONDUCTOR INTEGRATED CIRCUIT DEVICE

(75) Inventors: Sang-Jin Lee, Seoul (KR); Gin-Kyu Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 203 days.

(21) Appl. No.: 12/502,497

(22) Filed: Jul. 14, 2009

(65) Prior Publication Data

US 2010/0012933 A1    Jan. 21, 2010

(30) Foreign Application Priority Data

Jul. 17, 2008   (KR) .................. 10-2008-0069542

(51) Int. Cl.
*H01L 23/58*    (2006.01)

(52) U.S. Cl. .................. 257/48; 257/E27.098; 438/11

(58) Field of Classification Search .................. 257/48, 257/E27.098–E27.101, E27.077; 438/11, 438/14, 15, 18
See application file for complete search history.

(56) References Cited

U.S. PATENT DOCUMENTS

| 5,559,745 | A | 9/1996 | Banik et al. |
| 6,778,449 | B2 | 8/2004 | Breitwisch et al. |
| 2006/0192254 | A1* | 8/2006 | Yokoyama .................. 257/379 |

FOREIGN PATENT DOCUMENTS

| KR | 1020010055074 | 7/2001 |
| KR | 1020050030347 | 3/2005 |

OTHER PUBLICATIONS

Unexamined Patent Application [10-2003-0066572][machine's translation].*

* cited by examiner

*Primary Examiner* — Tony Tran
(74) *Attorney, Agent, or Firm* — F. Chau & Associates, LLC

(57) ABSTRACT

A test device includes a semiconductor substrate having a first test region and a second test region defined thereon, wherein a layout of the first test region includes first active regions separated from each other by isolation regions in the semiconductor substrate, second active regions formed between the first active regions, first gate lines formed on the semiconductor substrate, wherein each of the first gate lines has a first end adjacent to one of the first active regions and a second end adjacent to an end of one of the second active regions, respectively, first shared contacts each formed over a respective one of the second ends of the first gate lines and an upper part of one of the first active regions, and first nodes formed on the first shared contacts to be electrically connected to the first shared contacts, respectively.

8 Claims, 5 Drawing Sheets

TEST DEVICE AND A SEMICONDUCTOR INTEGRATED CIRCUIT DEVICE

CROSS-REFERENCE TO RELATED APPLICATION

This application claims priority to Korean Patent Application No. 10-2008-0069542 filed on Jul. 17, 2008 in the Korean Intellectual Property Office, the disclosure of which is incorporated by reference herein in its entirety.

BACKGROUND OF THE INVENTION

1. Technical Field

The present invention relates to a test device and a semiconductor integrated circuit device that has improved manufacturability.

2. Discussion of the Related Art

Static Random Access Memory (SRAM) is a type of semiconductor memory that, unlike Dynamic Random Access Memory (DRAM), does not have to be refreshed. SRAM is faster, but has less memory capacity than DRAM. Accordingly, SRAM is used where high bandwidth is a principle consideration. For example, SRAM may be used in a personal or laptop computer as a processor cache, or in a portable device such as a cellphone or handheld computer.

Static memory cells can be classified as thin film transistor (TFT) cells, full complementary metal oxide semiconductor (FCMOS) cells, etc. An FCMOS cell may include a plurality of pull-up transistors and pull-down transistors, which may form a latch, and a plurality of pass transistors may be used to access the latch.

As the integration density of semiconductor memory devices has increased, the size of memory cells and the size of metal contacts of the memory cells have decreased. The decrease in contact size can cause the metal contacts to be inaccurately patterned, thereby resulting in increased contact failures. Particularly, in the static memory cells, adjacent shared contacts may become electrically connected to each other. This electrical connection is referred to as a bridge.

To detect the occurrence of a bridge between adjacent shared contacts, nodes are connected to the respective adjacent shared contacts, and then, it is determined whether current flows between the nodes or not.

If there is current flow between the nodes, a determination may be made that a bridge has occurred between the adjacent shared contacts. However, there can be many reasons for why this bridge has occurred. For example, there could be a short-circuit between adjacent active regions, a short-circuit between a contact and a gate line, a short-circuit between nodes, and so on.

Therefore, there is a need to accurately determine the cause of current flow between adjacent shared contacts of a memory cell.

SUMMARY OF THE INVENTION

According to an exemplary embodiment of the present invention, there is provided a test device including a semiconductor substrate having a first test region and a second test region defined thereon, wherein a layout of the first test region includes a pair of first active regions separated from each other by isolation regions in the semiconductor substrate, a pair of second active regions formed between the first active regions, a pair of first gate lines formed on the semiconductor substrate, wherein each of the first gate lines has a first end adjacent to one of the first active regions and a second end adjacent to an end of one of the second active regions, respectively, a pair of first shared contacts each formed over a respective one of the second ends of the first gate lines and an upper part of one of the second active regions, and a pair of first nodes formed on the first shared contacts to be electrically connected to the first shared contacts, respectively, and wherein a layout of the second test region includes a pair of third active regions, a pair of fourth active regions, a pair of second shared contacts, and a pair of second nodes, wherein the pair of second active regions is surrounded by the isolation regions in the semiconductor substrate to correspond to the first active regions, the pair of fourth active regions is formed between the third active region to correspond to the second active regions, each of the pair of second shared contacts is formed on part of one of the second active regions and part of one of the isolation regions, respectively, to correspond to the first shared contacts, and the pair of second nodes is formed to correspond to the first nodes to be electrically connected to the second shared contacts, respectively.

The layout of the first test region further comprises a first current detection part that determines whether current flows between the pair of first nodes.

The layout of the second test region further comprises a second current detection part that determines whether current flows between the pair of second nodes.

Leakage current caused by at least one of the first gate lines is measured by determining whether current flows between the pair of first nodes and between the pair of second nodes.

The test device further includes a static memory cell region defined on the semiconductor substrate, wherein the static memory cell region has the same layout as the first test region.

According to an exemplary embodiment of the present invention, there is provided a semiconductor integrated circuit device including a semiconductor substrate having a first region and a second region defined thereon; a pair of first active regions formed in the first region, wherein the first active regions extend in a first direction in the semiconductor substrate and are separated from each other; a pair of second active regions formed in the first region between the first active regions; a pair of first active regions formed in the second region, wherein the first active regions extend in the first direction in the semiconductor substrate to correspond to the pair of first active regions in the first region; a pair of second active regions formed in the second region to correspond to the pair of second active regions in the first region; a pair of first gate lines extending in a second direction different from the first direction and separated from each other, wherein the first gate lines are included in one or both of the first and second regions, and wherein each of the first gate lines has a first end adjacent to one of the first active regions in the region in which it is formed and a second end adjacent to an end of one of the second active regions in the region in which it is formed, respectively; a pair of first shared contacts formed in the first region, wherein each contact is partially formed over a respective one of the second ends of the first gate lines in the first region and a top surface of one of the first active regions in the first region; a pair of second shared contacts formed in the second region to correspond to the pair of first shared contacts; a pair of first nodes formed in the first region that apply voltages to the pair of first shared contacts, respectively; and a pair of second nodes formed in the second region to correspond to the pair of first nodes, wherein the second nodes apply voltages to the pair of the second shared contacts, respectively.

The semiconductor integrated circuit device further includes a first current detection part formed in the first region that determines whether current flows between the pair of first nodes.

The semiconductor integrated circuit device further includes a second current detection part formed in the second region that determines whether current flows between the pair of second nodes.

Leakage current caused by at least one of the first gate lines is measured by determining whether current flows between the pair of first nodes and between the pair of second nodes.

The first region includes a first test region and the second region includes a second test region.

The semiconductor integrated circuit device further includes a static memory cell region defined on the semiconductor substrate, wherein the first active regions, the first gate lines, the first shared contacts and the first nodes, which are formed in the first region, have the same layouts as those of the static memory cell region.

An interlayer insulating layer is filled in an area of the second region that corresponds to the first gate lines in the first region.

The first region includes a static memory cell region and the second region includes a test region.

According to an exemplary of the present invention, there is provided a semiconductor integrated circuit device including a semiconductor substrate having a first region and a second region defined thereon; a plurality of active regions formed in the first region and the second region and separated from each other by a plurality of isolation regions; a plurality of gate lines formed on the semiconductor substrate in the first region and partially overlapping the active regions and the isolation regions; an interlayer insulating layer formed in the first region and the second region to cover a surface of the semiconductor substrate; a plurality of shared contacts formed in the first region and the second region to pass through the interlayer insulating layer, wherein the plurality of shared contacts are in contact with the active regions and the gate lines in the first region and are in contact with the active regions and the isolation regions in the second region; and a plurality of nodes formed in the first region and the second region to be electrically connected to the shared contacts in the first region and the second region, respectively.

A pair of the active regions, the shared contacts, and the nodes are formed in the first region and the second region to be adjacent to each other.

The semiconductor integrated circuit device further includes a pair of current detection parts formed in the first region and the second region, which determine whether current flows between a pair of the nodes in the first region and a pair of the nodes in the second region, respectively.

The current detection parts measure leakage current caused by at least one of the gate lines by determining whether current flows between a pair of the nodes in the first region and between a pair of the nodes in the second region.

The first region includes a first test region and the second region includes a second test region.

The semiconductor integrated circuit device further includes a static memory cell region defined on the semiconductor substrate, wherein the active regions, the gate lines, the shared contacts and the nodes, which are formed in the first test region, have the same layouts as those of the static memory cell region.

The first region includes a static memory cell region and the second region includes a test region.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Exemplary embodiments of the present invention will be described more fully hereinafter with reference to the accompanying drawings. The present invention may, however, be embodied in many different forms and should not be construed as being limited to the embodiments set forth herein.

It will be understood that when an element or layer is referred to as being "on", "connected to", or "coupled to", another element or layer, it can be directly on, connected or coupled to the other element or layer or intervening elements or layers may be present.

Spatially relative terms, such as "below", "beneath", "lower", "above", "upper" and the like, may be used herein for ease of description to describe one element or feature's relationship to another element(s) or feature(s) as illustrated in the figures. It will be understood that spatially relative terms may encompass different orientations of the device in use or operation in addition to the orientation depicted in the figures. For example, if the device in the figures is turned over, elements described as "below" or "beneath" other elements or features would then be oriented "above" the other elements or features.

A semiconductor integrated circuit device according to an exemplary embodiment of the present invention includes a static memory cell region and a test region defined on a semiconductor substrate.

Hereinafter, a constitution of the memory cell region of the semiconductor integrated circuit device according to an exemplary embodiment of the present invention will be described in detail with reference to FIGS. 1 and 2.

Figure 1:
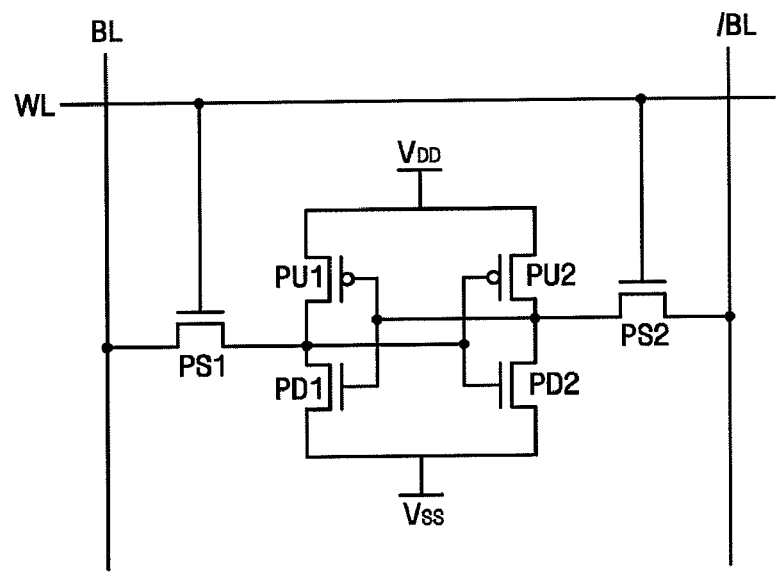
FIG. 1 is a circuit diagram of a static memory cell of a semiconductor integrated circuit device according to an exemplary embodiment of the present invention.

FIG. 1 is a circuit diagram of a static memory cell of a semiconductor integrated circuit device according to an exemplary embodiment of the present invention.

Referring to FIG. 1, the semiconductor integrated circuit device according to an exemplary embodiment of the present invention may include a static memory cell. The static memory cell may include a plurality of pull-up transistors PU1 and PU2 and pull-down transistors PD1 and PD2 that may form a latch. A plurality of pass transistors PS1 and PS2 may be used to access to the latch.

A unit cell of the static memory cell may include first and second pass transistors PS1 and PS2, first and second pull-down transistors PD1 and PD2, and first and second pull-up transistors PU1 and PU2. Here, each of the first and second pass transistors PS1 and PS2 and the first and second pull-down transistors PD1 and PD2 may be an NMOS transistor, and each of the first and second pull-up transistors PU1 and PU2 may be a PMOS transistor.

The sources of the first and second pull-down transistors PD1 and PD2 may be connected to a ground line Vss, and the sources of the first and second pull-up transistors PU1 and PU2 may be connected to a power feed line $V_{DD}$.

Further, the first pull-down transistor PD1 formed of an NMOS transistor and the first pull-up transistor PU1 formed of a PMOS transistor may form a first inverter. The second pull-down transistor PD2 formed of an NMOS transistor and the second pull-up transistor PU2 formed of a PMOS transistor may form a second inverter.

The output terminals of the first and second inverters may be connected to the sources of the first and second pass transistors PS1 and PS2, respectively. The input and output terminal of the first inverter may be connected to the output and input terminals of the second inverter, respectively, to form one latch circuit.

In addition, the drains of the first and second pass transistors PS1 and PS2 may be connected to first and second bit lines BL and /BL, respectively.

Figure 2:
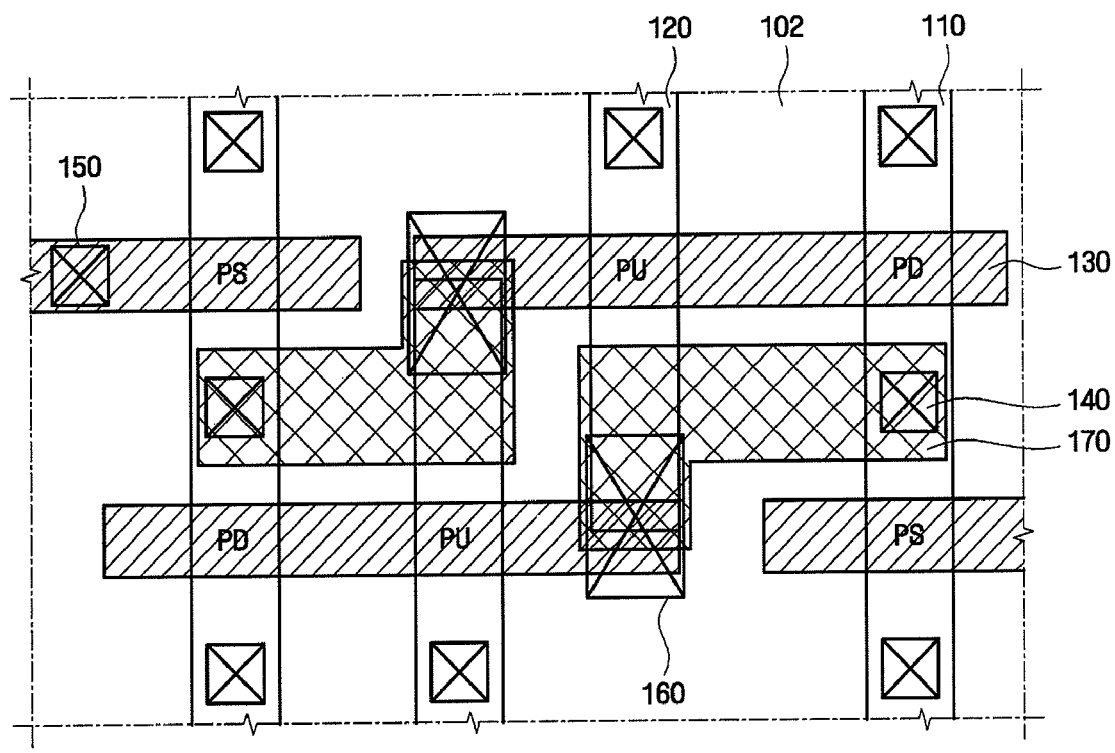
FIG. 2 illustrates a layout of a static memory cell region of the semiconductor integrated circuit device according to an exemplary embodiment of the present invention.

FIG. 2 illustrates a layout of a static memory cell region of the semiconductor integrated circuit device according to an exemplary embodiment of the present invention.

Referring to FIG. 2, a plurality of first conductivity type active regions 110 are defined by isolation regions 102 and extend in a first direction on the static memory cell region of the semiconductor integrated circuit device. In addition, a plurality of second conductivity type active regions 120 are separated from the first conductivity type active regions 110 and extend in the same direction with the first conductivity type active regions 110. The second conductivity type active regions 120 are shorter than the first conductivity type active regions 110. Here, the first conductivity type active regions 110 refer to active regions of a particular conductivity type such as an N-type, and the second conductivity type active regions 120 refer to active regions of a particular conductivity type such as a P-type.

A plurality of gate lines 130 traversing the first conductivity type active regions 110 or the second conductivity type active regions 120 are formed in a second direction perpendicular to the first direction in which the first conductivity type active regions 110 or the second conductivity type active regions 120 are formed. The plurality of gate lines 130 extend in the second direction and two gate lines 130 may be adjacent to each other in the first direction. Here, ends of the gate lines 130 may be formed to be adjacent to the first conductivity type active regions 110 or the second conductivity type active regions 120, or to partially overlap the first conductivity type active regions 110 or the second conductivity type active regions 120.

The plurality of gate lines 130 partially overlapping the first conductivity type active regions 110 or the second conductivity type active regions 120 constitute transistors. Here, the transistors formed at the regions overlapping the first conductivity type active regions 110 may be N-type transistors, e.g., pull-down transistors or pass transistors. The transistors formed at the regions overlapping the second conductivity type active regions 120 may be P-type transistors, e.g., pull-up transistors. A static memory cell C may be constituted by six transistors labeled "PS," "PU" and "PD" in FIG. 2.

Source/drain regions are formed at both sides of the regions where the first conductivity type active regions 110 or the second conductivity type active regions 120 overlap the plurality of gate lines 130. A plurality of first contacts 140 are formed over portions of the source/drain regions. The plurality of first contacts 140 connect the source/drain regions to upper wirings. In addition, second contacts 150 are formed over portions of the gate lines 130, and a voltage is applied to the gate lines 130 through the second contacts 150.

In addition, shared contacts 160 are formed over ends of the gate lines 130 adjacent to the second conductivity type active regions 120 and top surfaces of the second conductivity type active regions 120. Here, a pair of shared contacts 160 are formed to be adjacent to each other at ends of a pair of adjacent second conductivity type active regions 120. The shared contacts 160 have long and short axes, and the pair of shared contacts 160 are adjacent to each other in the short-axis direction.

Silicide regions may be formed on top surfaces of the first conductivity type active regions 110 and on the second conductivity type active regions 120 not overlapping with the gate lines 130 or over the gate lines 130. The silicide regions reduce contact resistance between each of the first contacts 140, the second contacts 150 and the shared contacts 160.

A plurality of nodes 170 are formed over an interlayer insulating layer (not shown) covering the semiconductor substrate having the shared contacts 160. The plurality of nodes 170 are electrically connected to the plurality of shared contacts 160, respectively. A voltage may be applied to the respective shared contacts 160 through the nodes 170.

Figure 3A:
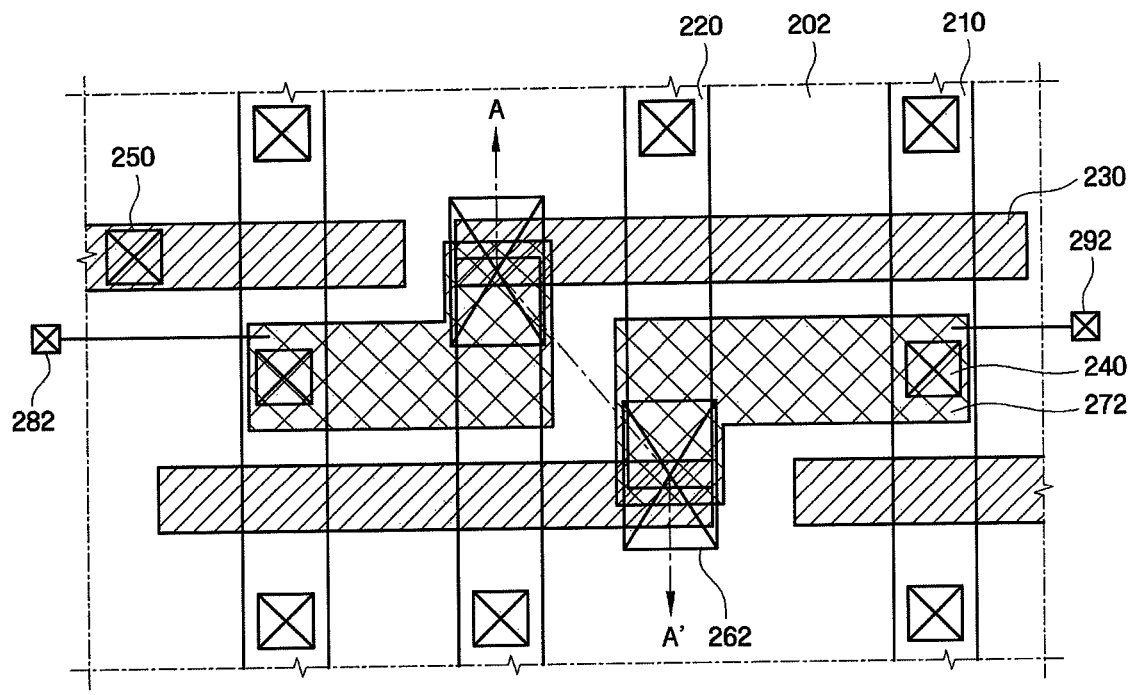
FIG. 3A illustrates a layout of a first test region of the semiconductor integrated circuit device according to an exemplary embodiment of the present invention.
Figure 3B:
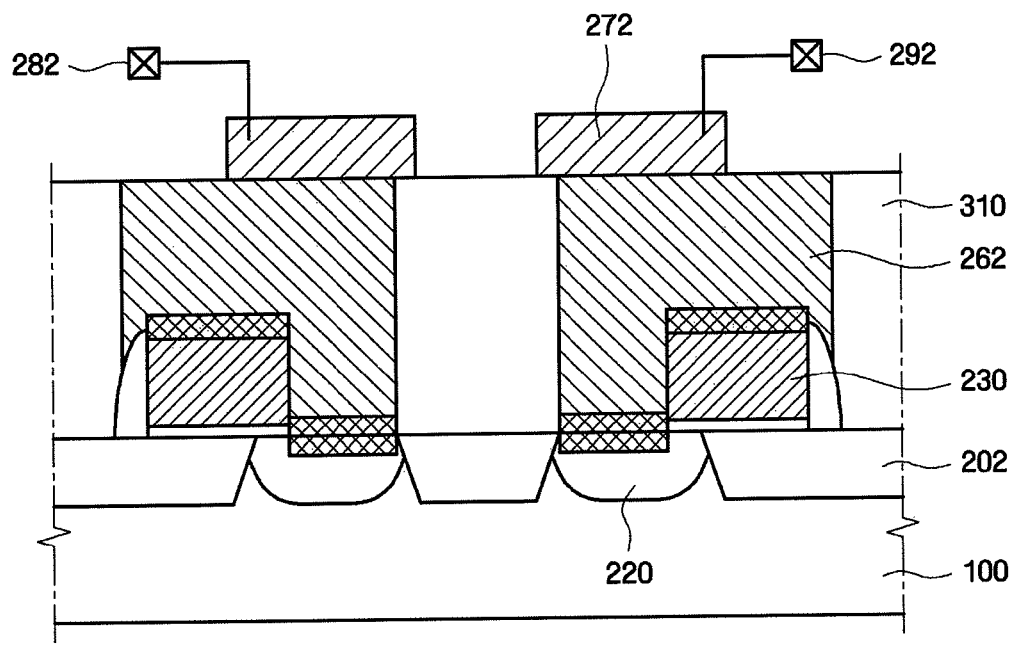
FIG. 3B is a cross-sectional view of the first test region taken along line A-A' of FIG. 3A.
Figure 4A:
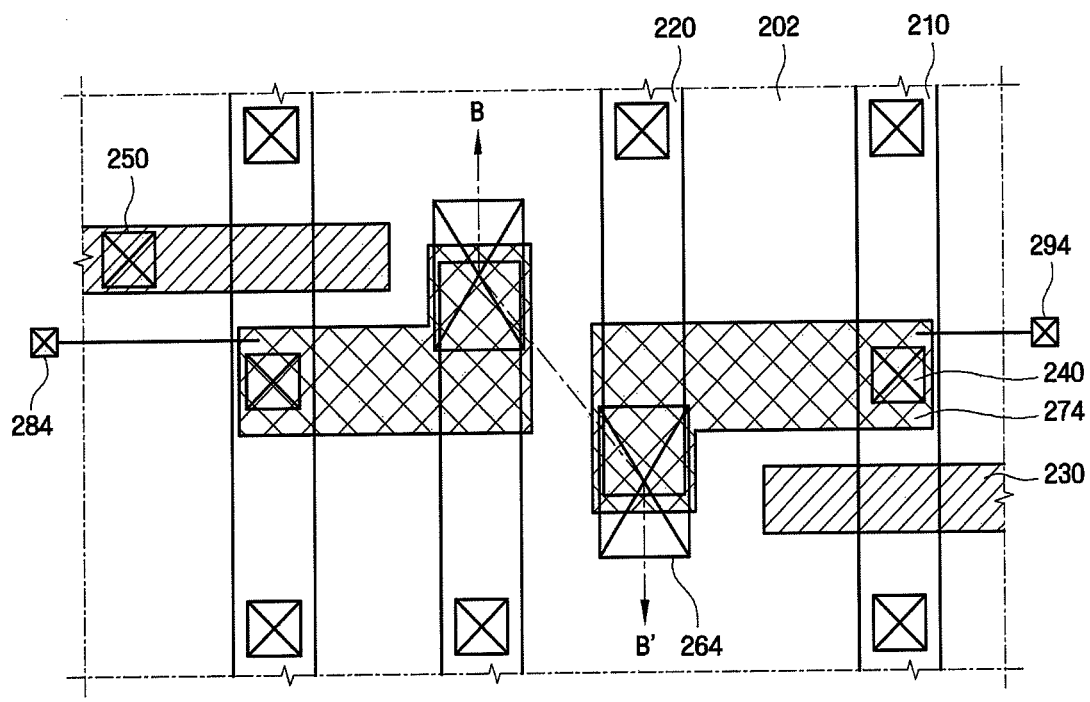
FIG. 4A illustrates a layout of a second test region of the semiconductor integrated circuit device according to an exemplary embodiment of the present invention.
Figure 4B:
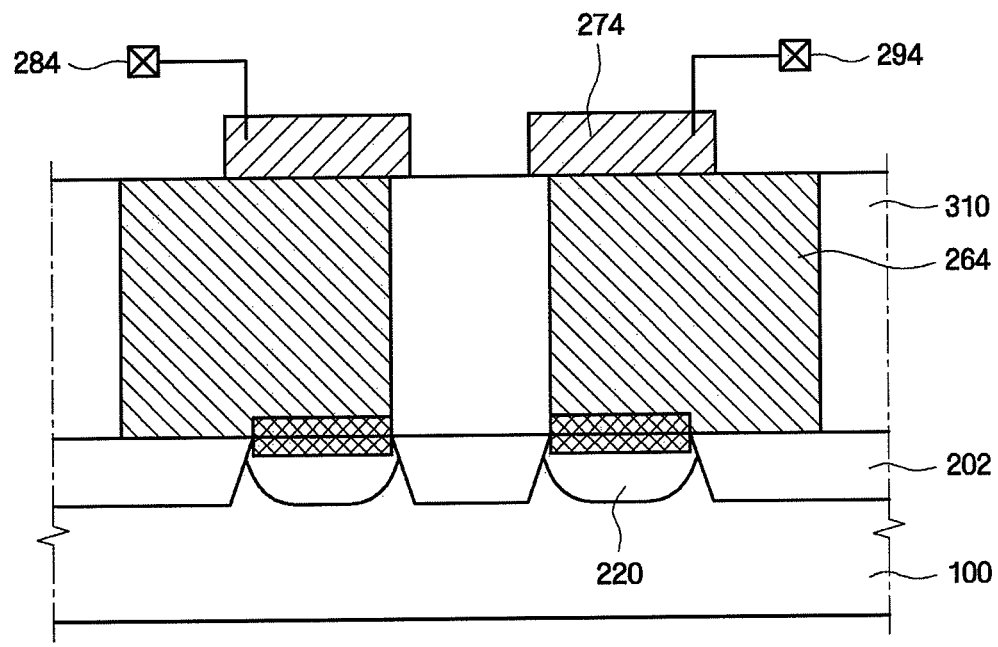
FIG. 4B is a cross-sectional view of the second test region taken along line B-B' of FIG. 4A.

Hereinafter, a constitution of a test region of the semiconductor integrated circuit device according to an exemplary embodiment of the present invention will be described with reference to FIGS. 2 through 4B. FIG. 3A illustrates a layout of a first test region of the semiconductor integrated circuit device according to an exemplary embodiment of the present invention, FIG. 3B is a cross-sectional view of the first test region taken along line A-A' of FIG. 3A, FIG. 4A illustrates a layout of a second test region of the semiconductor integrated circuit device according to an exemplary embodiment of the present invention, and FIG. 4B is a cross-sectional view of the second test region taken along line B-B' of FIG. 4A. Here, FIG. 2 illustrates a static memory cell region, FIGS. 3A and 3B illustrate a first test region, and FIGS. 4A and 4B illustrate a second test region.

Referring to FIGS. 2 through 3B, the first test region of the semiconductor integrated circuit device according to an exemplary embodiment of the present invention is formed to have the same layout as that of the static memory cell region illustrated in FIG. 2.

For example, first conductivity type test active regions 210 and second conductivity type test active regions 220 are formed in a first test region. The first conductivity type test active regions 210 and the second conductivity type test active regions 220 are formed to correspond to the first conductivity type active regions 110 and the second conductivity type active regions 120 of the static memory cell region, respectively. In other words, the first conductivity type test active regions 210 and the second conductivity type test active regions 220 are substantially the same as or similar to the first conductivity type active regions 110 and the second conductivity type active regions 120 of the static memory cell region.

Also formed in the first test region are a plurality of test gate lines 230 traversing the first conductivity type test active regions 210 and the second conductivity type test active regions 220 in the second direction. The plurality of test gate lines 230 extend in the second direction and two test gate lines 230 may be adjacent to each other in the first direction. The plurality of test gate lines 230 are formed to correspond to the plurality of gate lines 130 of the static memory cell region.

A plurality of first test shared contacts 262 are formed over ends of some of the plurality of test gate lines 230. Here, the plurality of first test shared contacts 262 are formed to correspond to the plurality of shared contacts 160 of the static memory cell region. The respective first test shared contacts 262 have long and short axes, and may be arranged in pairs to be adjacent to each other in the short-axis direction. In addition, contacts 240 and 250 may further be formed to correspond to the first contacts 140 and the second contacts 150.

First test nodes 272 are formed over an interlayer insulating layer 310 covering a semiconductor substrate 100 having the first test shared contacts 262. The first test nodes 272 are formed to correspond to the nodes 170 of the static memory cell region.

In addition, first current measuring units 282 and 292 are connected to the first test nodes 272. The first current measuring units 282 and 292 include first input pads 282 for allowing current to flow through one of a pair of first test nodes 272, which are adjacent to each other, and first output pads 292 for determining whether the current is detected at the other of the pair of first test nodes 272.

Accordingly, the occurrence of a bridge between the first test shared contacts 262, which are adjacent to each other, can be detected. This is done, for example, by applying a voltage to the first test node 272 connected to one of the pair of first test shared contacts 262, which are adjacent to each other, and measuring current levels of the other first test node 272 connected to the other first test shared contact 262 before and after the voltage is applied to determine whether there is a change in the current in the other first test node 272 connected to the other first test shared contact 262.

As described above, the first test region has the same constitution as that of the static memory cell region illustrated in FIG. 2.

Referring to FIGS. 3A through 4B, the second test region is different from the first test region in that no test gate line is formed in the second test region. In other words, the second test region has substantially the same layout as the first test region, except for the test gate lines 230. Accordingly, the second test region has the same layout as the static memory cell region, except for the gate lines 130.

Like the first test region, the second test region includes first conductivity type test active regions 210 and second conductivity type test active regions 220. However, unlike in the first test region, no conductive patterns are formed in a region where the test gate lines 230 are formed. For example, as shown in FIG. 4B, in the second test region, an interlayer insulating layer 310 covers the region corresponding to the test gate lines 230 of the first test region.

In addition, second test shared contacts 264 are formed on ends of the second conductivity type test active regions 220 and over portions of the isolation regions 202. Here, the second test shared contacts 264 are formed to correspond to the first test shared contacts 262 of the first test region. However, the second test shared contacts 264 are different from the first test shared contacts 262 in that they are not connected to gate lines and are in contact with ends of the second conductivity type test active regions 220 and the isolation regions 202.

The second test shared contacts 264 have second test nodes 274 formed thereon to apply a voltage to the second test shared contacts 264. The second test nodes 274 are formed to correspond to the first test nodes 272.

In addition, second current measuring units 284 and 294 are connected to the second test nodes 274. The second current measuring units 284 and 294 may include second input pads 284 for allowing current to flow through one of a pair of second test nodes 274, which are adjacent to each other, and second output pads 294 for determining whether the current is detected at the other of the pair of second test nodes 274.

Accordingly, the occurrence of a bridge between the second test shared contacts 264, which are adjacent to each other, can be detected. This is done, for example, by applying a voltage to the second test node 274 connected to one of the pair of second test shared contacts 264, which are adjacent to each other, and measuring current levels of the other second test node 274 connected to the other test shared contact 264 before and after the voltage is applied to determine whether there is a change in the current in the other second test node 274 connected to the other second test shared contact 264.

Figure 5:
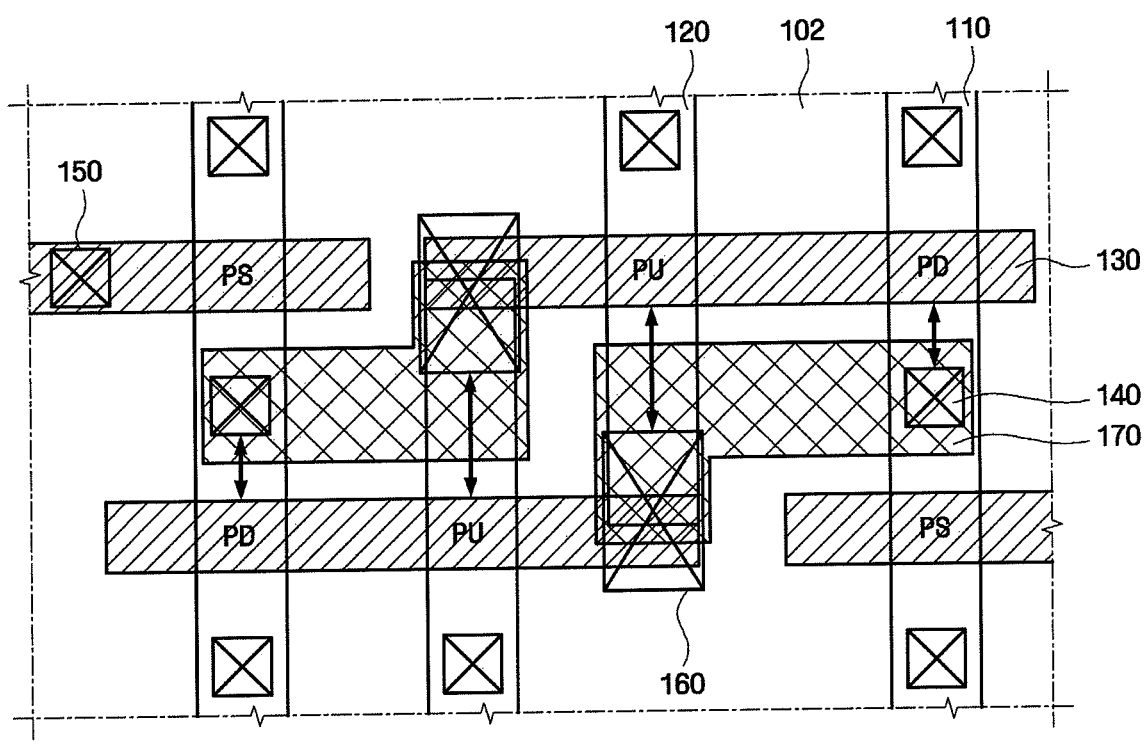
FIG. 5 illustrates a layout of a static memory cell region of a semiconductor integrated circuit device to describe testing according to an exemplary embodiment of the present invention.

FIG. 5 illustrates a layout of a static memory cell region of a semiconductor integrated circuit device to describe testing according to an exemplary embodiment of the present invention.

It is to be noted that various parameters may be associated with the occurrence of a short-circuit between adjacent nodes in a static memory cell region of a semiconductor integrated circuit device. Therefore, in a case where adjacent nodes are short-circuited, it may not be easy to determine which part of the semiconductor integrated circuit device is defective.

Referring to FIG. 5, in a case where adjacent nodes 170 are short-circuited, the short-circuit is caused by the gate lines 130, as indicated by the arrows. When the shared contacts 160 adjacent to the gate lines 130 are connected to the first contacts 140 adjacent to the gate lines 130, current may flow between the nodes 170. In other words, the adjacent nodes 170 may be short-circuited due to a structural problem of the gate lines 130.

As described above, the semiconductor integrated circuit device according to an exemplary embodiment of the present invention includes a first test region and a second test region.

In the first test region, it can be determined whether the first test nodes 272 are short-circuited or not by applying a voltage to one of a pair of the first test nodes 272, which are adjacent to each other, and observing whether current is detected at the other of the pair of first test nodes 272 to which the voltage is not applied.

In the second test region, it can be determined whether the second test nodes 274 are short-circuited or not by applying a voltage to one of a pair of the second test nodes 274, which are adjacent to each other, and measuring current levels of the second output pad 294 to determine whether current is detected at the other of the pair of second test nodes 274 to which the voltage is not applied.

In this case, if no short-circuit occurs between the second test nodes 274 while the first test nodes 272 are short-circuited, it can be understood that the short-circuit of the first test nodes 272 is caused by the test gate lines 230, since the second test region has the same constitution as the first test region, except for the test gate lines 230.

In addition, if the short-circuit occurs both between the first test nodes 272 and between the second test nodes 274, the short-circuit occurring between the first test nodes 272 in the first test region is not caused by the test gate lines 230. This is so because the short-circuit has also occurred between the second test nodes 274 in the second test region, which has no test gate lines 230 formed therein.

In other words, the semiconductor integrated circuit device according to an exemplary embodiment of the present invention can determine not only the occurrence of a short-circuit between the first test nodes 272, which are adjacent to each other in the first test region, but also the occurrence of a short-circuit between the second test nodes 274 in the second test region. Therefore, the semiconductor integrated circuit device according to an exemplary embodiment of the present invention can accurately determine whether the short-circuit between the first test nodes 272 in the first test region is caused by the test gate lines 230 or not.

In addition, the semiconductor integrated circuit device according to an exemplary embodiment of the present invention includes the first test region and the second test region having layouts corresponding to those of the static memory cell region. Therefore, the determination result can be reflected in the static memory cell region. Accordingly, the static memory cell region can be tested with improved accuracy, thereby improving the manufacturability of static memory cells.

Figure 6:
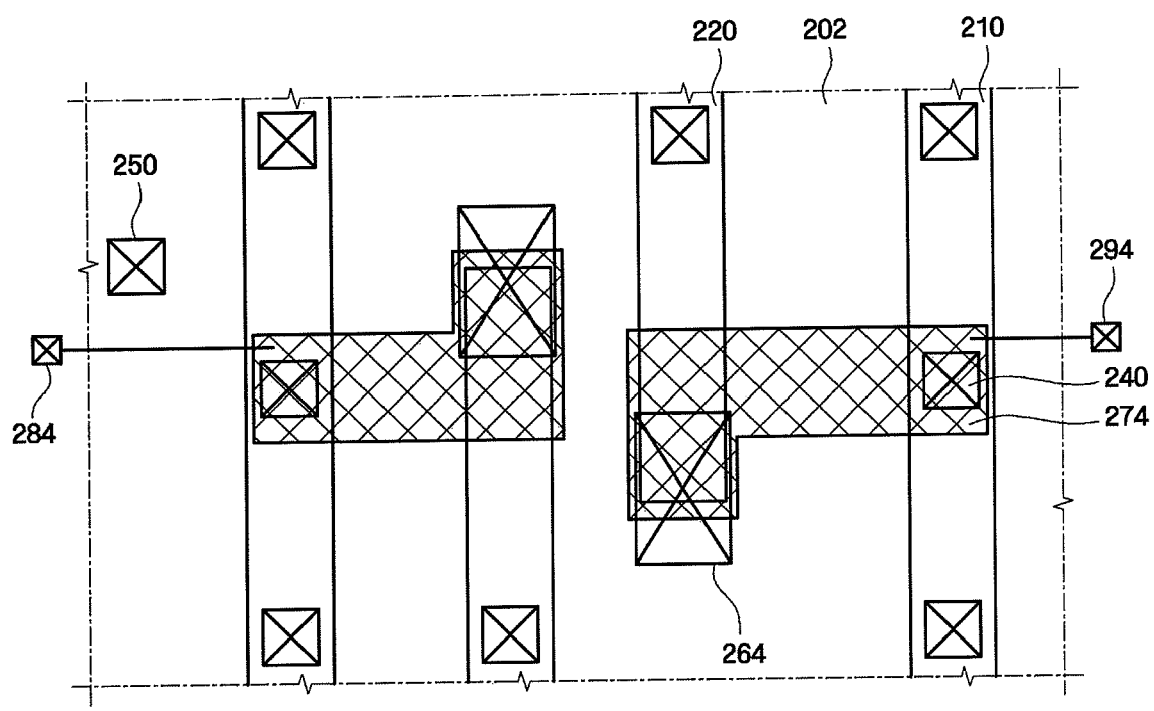
FIG. 6 illustrates a layout of a second test region of the semiconductor integrated circuit device according to an exemplary embodiment of the present invention.

FIG. 6 illustrates a layout of a second test region of the semiconductor integrated circuit device according to an exemplary embodiment of the present invention.

In the semiconductor integrated circuit device according to the present exemplary embodiment, all of the gate lines can be removed from the second test region.

Unlike FIG. 4A, in which only the test gate lines 230 electrically connected to the second test nodes 274 to be tested are removed, FIG. 6 shows that the test gate lines 230 are all removed. However, the determination of whether or not a short-circuit between the second test nodes 274 is caused by the test gate lines 230 is barely affected by removing all the test gate lines 230.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor integrated circuit device, comprising:
 a semiconductor substrate having a first region and a second region defined thereon;
 a pair of first active regions formed in the first region, wherein the first active regions extend in a first direction in the semiconductor substrate and are separated from each other;
 a pair of second active regions formed in the first region between the first active regions;
 a pair of first active regions formed in the second region, wherein the first active regions extend in the first direction in the semiconductor substrate to correspond to the pair of first active regions in the first region;
 a pair of second active regions formed in the second region to correspond to the pair of second active regions in the first region;
 a pair of first gate lines extending in a second direction different from the first direction and separated from each other, wherein the first gate lines are included in one or both of the first and second regions, and wherein each of the first gate lines has a first end adjacent to one of the first active regions in the region in which it is formed and a second end adjacent to an end of one of the second active regions in the region in which it is formed, respectively;
 a pair of first shared contacts formed in the first region, wherein each contact is partially formed over a respective one of the second ends of the first gate lines in the first region and a top surface of one of the second active regions in the first region;
 a pair of second shared contacts formed in the second region to correspond to the pair of first shared contacts;
 a pair of first nodes formed in the first region that apply voltages to the pair of first shared contacts, respectively; and
 a pair of second nodes formed in the second region to correspond to the pair of first nodes, wherein the second nodes apply voltages to the pair of the second shared contacts, respectively.

2. The semiconductor integrated circuit device of claim 1, further comprising a first current detection part formed in the first region that determines whether current flows between the pair of first nodes.

3. The semiconductor integrated circuit device of claim 1, further comprising a second current detection part formed in the second region that determines whether current flows between the pair of second nodes.

4. The semiconductor integrated circuit device of claim 1, wherein leakage current caused by at least one of the first gate lines is measured by determining whether current flows between the pair of first nodes and between the pair of second nodes.

5. The semiconductor integrated circuit device of claim 1, wherein the first region comprises a first test region and the second region comprises a second test region.

6. The semiconductor integrated circuit device of claim 5, further comprising a static memory cell region defined on the semiconductor substrate, wherein the first active regions, the first gate lines, the first shared contacts and the first nodes, which are formed in the first region, have the same layouts as those of the static memory cell region.

7. The semiconductor integrated circuit device of claim 5, wherein an interlayer insulating layer is filled in an area of the second region that corresponds to the first gate lines in the first region.

8. The semiconductor integrated circuit device of claim 1, wherein the first region comprises a static memory cell region and the second region comprises a test region.

* * * * *